United States Patent
Inaba

[19]

[11] Patent Number: 6,093,958
[45] Date of Patent: Jul. 25, 2000

[54] LEAD-ON-CHIP TYPE SEMICONDUCTOR DEVICE HAVING THIN PLATE AND METHOD FOR MANUFACTURING THE SAME

[75] Inventor: Takehito Inaba, Tokyo, Japan

[73] Assignee: NEC Corporation, Japan

[21] Appl. No.: 09/233,003

[22] Filed: Jan. 19, 1999

[30] Foreign Application Priority Data

Jan. 19, 1998 [JP] Japan .................. 10-021396

[51] Int. Cl.⁷ ................. H01L 23/495; H01L 23/48
[52] U.S. Cl. ................. 257/672; 257/677; 257/671; 257/674; 257/783
[58] Field of Search .................. 257/672, 667, 257/671, 674, 783, 678

[56] References Cited

U.S. PATENT DOCUMENTS

| | | | |
|---|---|---|---|
| 4,138,691 | 2/1979 | Bonkohara et al. | 357/70 |
| 5,042,919 | 8/1991 | Yabu et al. | 257/672 |
| 5,126,824 | 6/1992 | Ueda | 257/672 |
| 5,157,478 | 10/1992 | Ueda et al. | 257/675 |
| 5,231,303 | 7/1993 | Kasahara et al. | 257/666 |
| 5,334,857 | 8/1994 | Wada | 257/666 |
| 5,391,916 | 2/1995 | Kohno et al. | 257/676 |
| 5,442,232 | 8/1995 | Goto et al. | 257/688 |
| 5,612,569 | 3/1997 | Murakami et al. | 257/666 |
| 5,614,760 | 3/1997 | Osono et al. | 257/668 |
| 5,648,682 | 7/1997 | Nakazawa et al. | 257/673 |
| 5,656,864 | 8/1997 | Mitsue et al. | 257/787 |
| 5,659,198 | 8/1997 | Okutomo et al. | 257/666 |
| 5,703,407 | 12/1997 | Hori | 257/666 |
| 5,767,527 | 6/1998 | Yoneda et al. | 257/675 |
| 5,834,831 | 11/1998 | Kubota et al. | 257/674 |
| 5,837,368 | 11/1998 | Hiroe et al. | 257/666 |

FOREIGN PATENT DOCUMENTS

| | | | |
|---|---|---|---|
| 069241 | 10/1992 | European Pat. Off. | H01L 21/68 |
| 06338536 | 6/1994 | European Pat. Off. | H01L 21/60 |
| 08162558 | 6/1996 | European Pat. Off. | H01L 23/04 |
| 8-78482 | 3/1996 | Japan . | |
| 8-255862 | 10/1996 | Japan . | |

*Primary Examiner*—David Hardy
*Assistant Examiner*—Jhihan B Clark
*Attorney, Agent, or Firm*—Hayes, Soloway, Hennessey, Grossman & Hage, P.C.

[57] ABSTRACT

In a semiconductor device having a lead-on-chip structure, a thin plate is arranged in an outer peripheral area of a semiconductor element and has a thickness substantially the same as that of the semiconductor element.

10 Claims, 13 Drawing Sheets

LEAD-ON-CHIP TYPE SEMICONDUCTOR DEVICE HAVING THIN PLATE AND METHOD FOR MANUFACTURING THE SAME

BACKGROUND OF THE INVENTION

1. Field of the Invention

The present invention relates to a semiconductor device having a lead-on-chip (LOC) structure and a method for manufacturing such a device.

2. Description of the Related Art

As a result of the development of memory devices having a large storage capacity such as dynamic random access memory (DRAM) devices, semiconductor elements of such devices have been dimensionally enlarged and take a remarkably larger space in a memory package than ever. Thus, in recent years package structures having an LOC structure have been proposed in the technological field of designing packages containing semiconductor elements that take a large space in the package.

Meanwhile, as a result of the development of the diffusion technology, semiconductor elements can be made smaller so that semiconductor elements having the same capacity have been increasingly down-sized on almost a year by year basis.

Incidentally, the external dimensions of packages are standardized and hence packages are hardly down-sized in terms of external dimensions even if the semiconductor elements they contain are down-sized. Thus, as the product cycle goes into a stage of maturity, the semiconductor elements of packages tend to occupy a reduced space in the package even if they have an LOC structure.

With the semiconductor element occupying a small space relative to the size of the package, however, the manufacturing yield is reduced, a large warp is created in a package, and a large thermal resistance is created in the package. This will be explained later in detail.

SUMMARY OF THE INVENTION

It is a main object of the present invention to increase the manufacturing yield of an LOC type semiconductor device.

According to the present invention, in a semiconductor device having an LOC structure, a thin plate having a thickness substantially the same as that of a semiconductor element is arranged in an outer peripheral area of the semiconductor element. As a result, in a package having an LOC structure and including a semiconductor element that occupies only a small space relative to the size of the package, the region where the thickness of resin on the upper surface of inner leads and the thickness of resin of the lower surface of the inner leads are unbalanced is reduced in an outer peripheral area of the semiconductor element.

The thin plate can operate as a bus bar to exploit the effect of the power sources by using an electrically conductive material for it and connecting electrodes on the semiconductor element and the inner leads by means of respective bonding coires.

BRIEF DESCRIPTION OF THE DRAWINGS

The present invention will be more clearly understood from the description as set below, as compared with the prior art, with reference to the accompanying drawings, wherein.

DESCRIPTION OF THE PREFERRED EMBODIMENTS

Before the description of the preferred embodiments, prior art semiconductor devices using an LOC structure will be explained with reference to FIGS. 1, 2, 3, 4, 5A through 5D, and 6.

Figure 1:
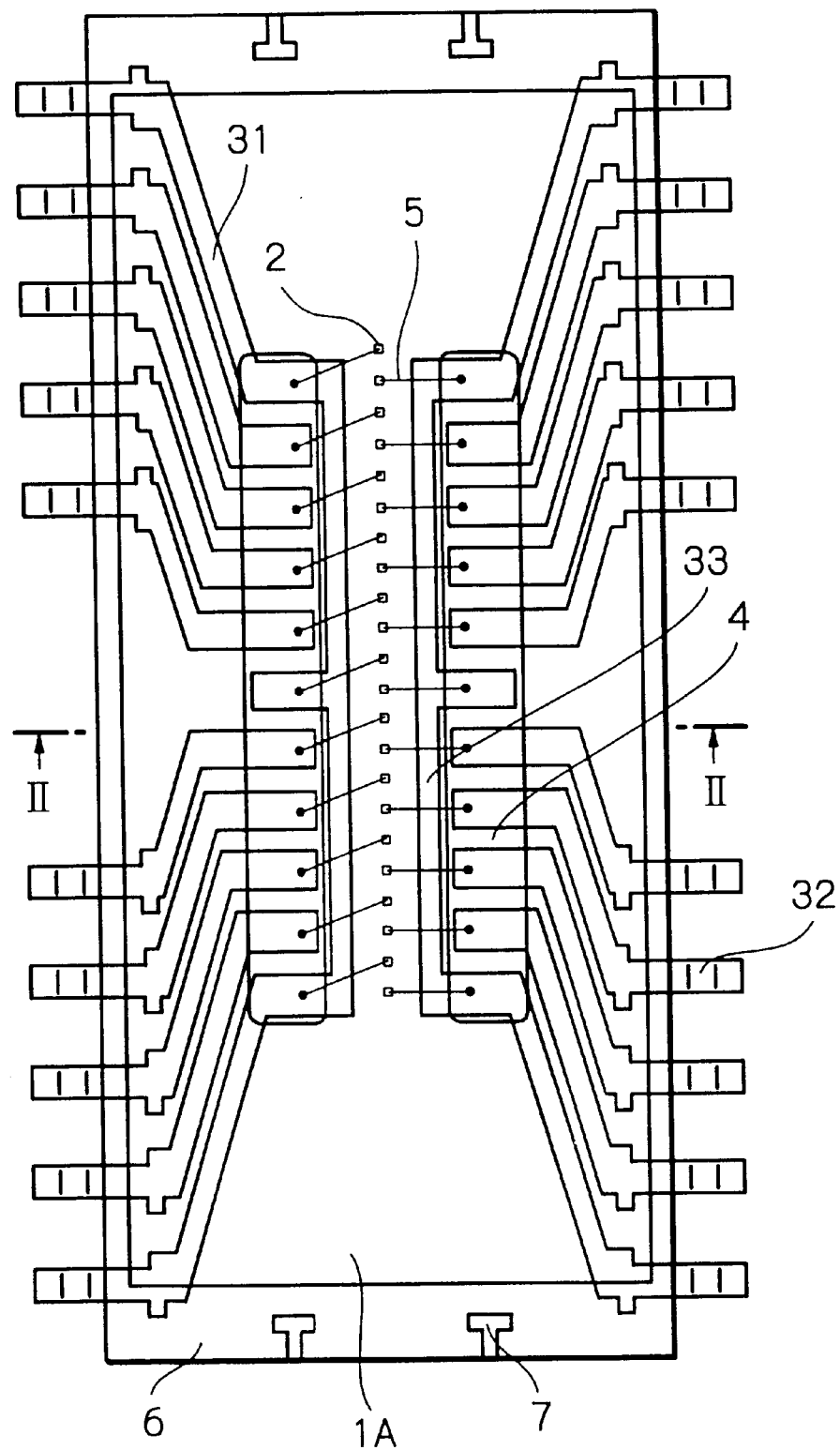
FIG. 1 is a plan view illustrating a first prior art semiconductor device having an LOC structure.
Figure 2:
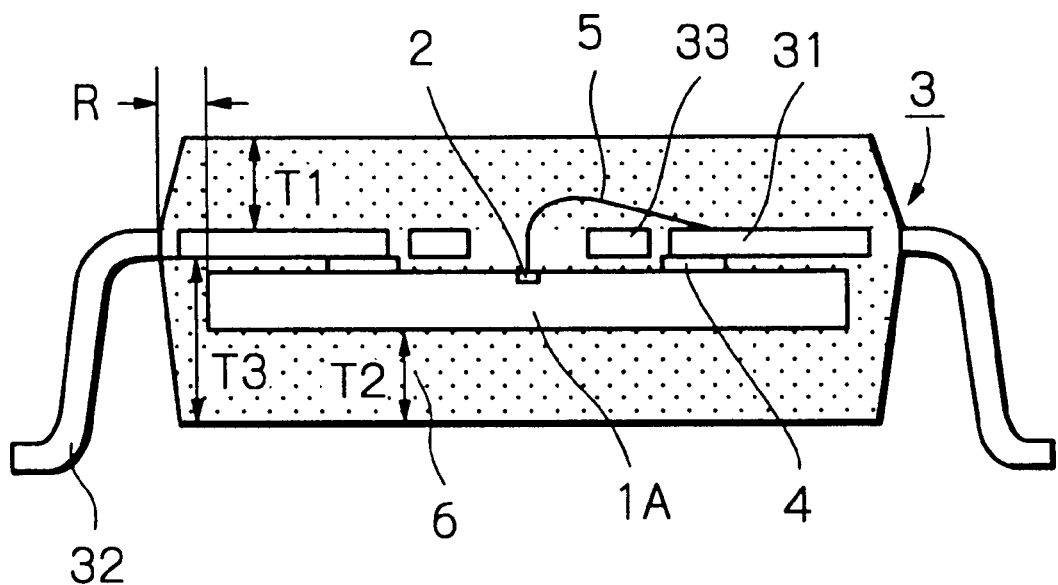
FIG. 2 is a cross-sectional view taken along the line II—II of FIG. 1.

FIG. 1 is a plan view illustrating a first prior art semiconductor device having an LOC structure, and FIG. 2 is a cross-sectional view taken along the II—II line of FIG. 1.

In FIGS. 1 and 2, electrodes 2 are arranged in a single row at the center of a semiconductor element 1A taking a large space in a package. A lead frame 3 in constructed by inner leads 31, outer leads 32 and bus bars 33.

Each of the inner leads 31 is securely held to the semiconductor element 1A at the front end thereof by means of an adhesive tape 4, and the inner leads 31 are connected to be related ones of the electrodes 2 by means of bonding wire 5. The bus bars 33 are arranged between the electrodes 2 and the inner leads 31. The bonding wire 5 passes over the bus bars 33.

As illustrated in FIG. 1, the outer leads 32 are lead out from respective positions offset from the center of the package as viewed in cross section.

Reference numeral 6 designates a sealing resin layer. The thickness T1 of the sealing resin layer 6 on the inner leads 31 is equal to the thickness T2 of the sealing resin layer 6 under the semiconductor element 1A. While the thickness T1 of the sealing resin layer 6 on the inner leads 31 is not equal to the thickness T3 of the sealing resin layer 6 under the inner leads 31, the region R of the sealing resin layer 6 having ill-balanced thickness is very small, because the semiconductor element 1A occupies a large space within the package.

In FIG. 1, reference numeral 7 denotes suspension pins.

Figure 3:
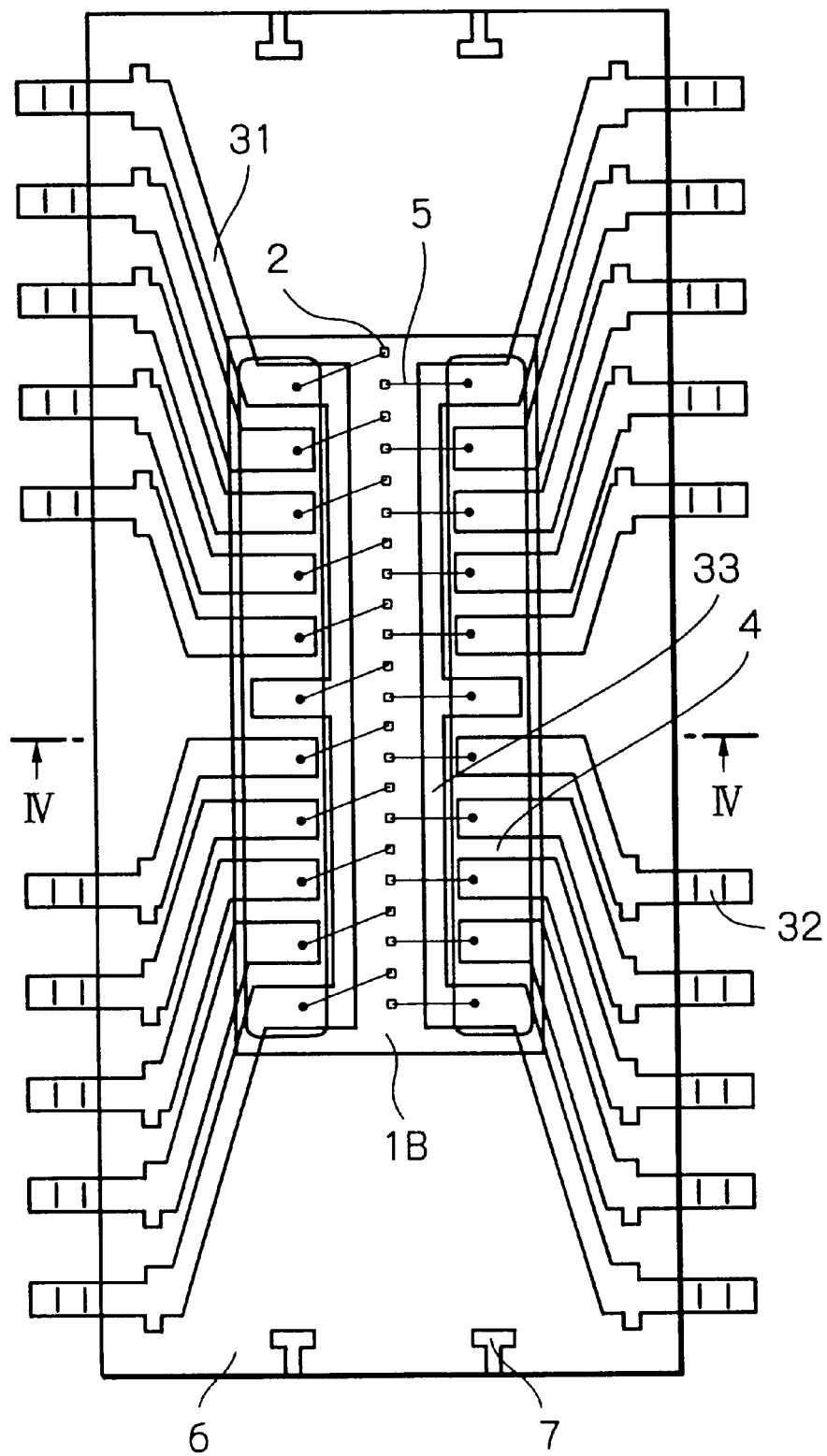
FIG. 3 is a plan view illustrating a second prior art semiconductor device having an LOC structure.
Figure 4:
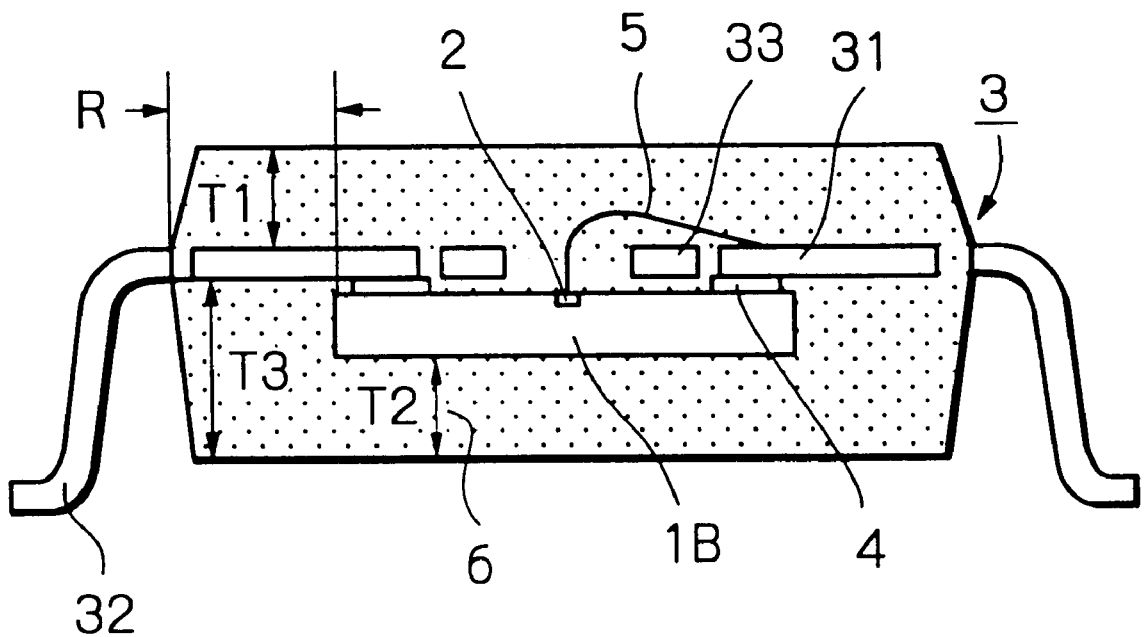
FIG. 4 is a cross-sectional view taken along the line IV—IV of FIG. 3.

FIG. 3 is a plan view illustrating a second prior art semiconductor device having an LOC structure, and FIG. 4 is a cross-sectional view taken along the IV—IV line of FIG. 3.

In FIGS. 3 and 4, the package contains a semiconductor element 1B taking only a small space in the package. The region R of the sealing resin layer 6 having ill-balanced thicknesses is very large, because the semiconductor element 1B occupies a small space within the package.

A method for manufacturing the semiconductor devices as illustrated in FIGS. 3 and 4 will be explained next with reference to FIGS. 5A through 5D.

Figure 5A:
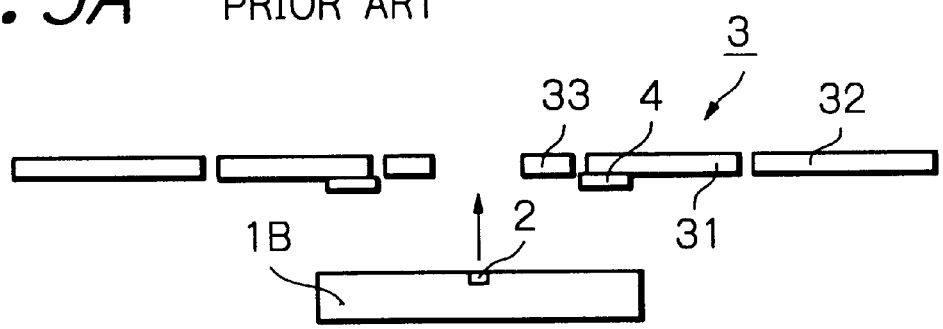
FIGS. 5A through 5D are cross-sectional views for explaining a method for manufacturing the semiconductor device of FIGS. 3 and 4.

First, referring to FIG. 5A, a semiconductor element 1B having electrodes 2 and a lead frame 3 having inner leads 31, outer leads 32 and bus bars 33 are placed in position. Then, an adhesive tape 4 is bonded to the inner leads 31, and then the semiconductor element 1B is bonded to the lead frame 3.

Figure 5B:
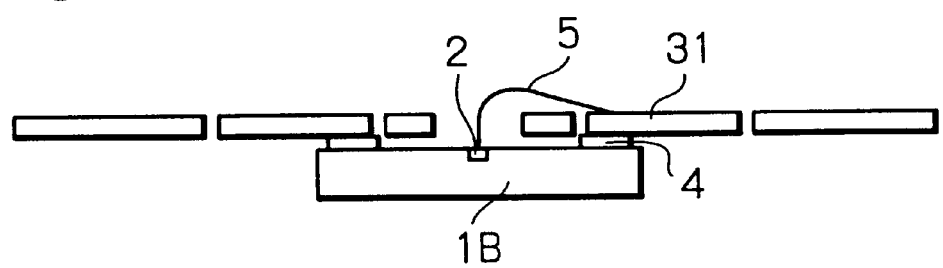

Next, referring to FIG. 5B, the electrodes 2 of the semiconductor element 1B and the corresponding inner leads 31 are connected by respective bonding wire 5.

Figure 5C:
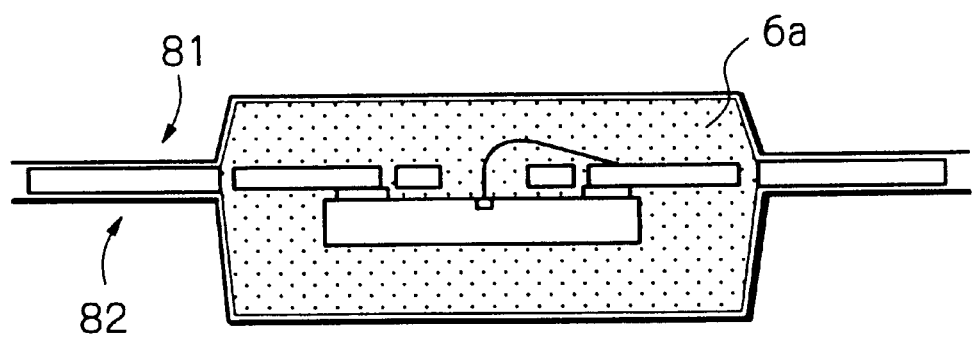

Next, referring to FIG. 5C, the lead frame 3 to which the semiconductor element 1B has been bonded is sandwiched by sealing metal mold halves 81 and 82, and then resin 6a is injected under pressure into the space between the sealing metal mold halves 81 and 82. Subsequently, the sealing metal mold halves 81 and 82 are removed.

Figure 5D:
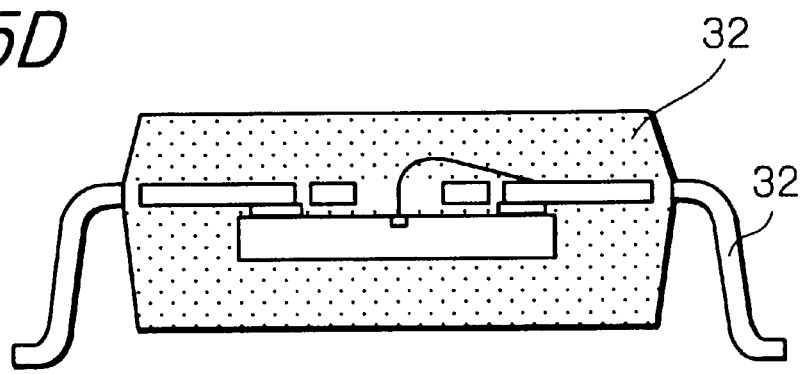

Finally, referring to FIG. 5D, after cutting and removing tie bars (not shown), the outer leads 32 are plated (not shown). Then, the outer leads 32 are cut and removed from the lead frame 3, and then shaped to show a desired profile to complete the semiconductor device.

Figure 6:
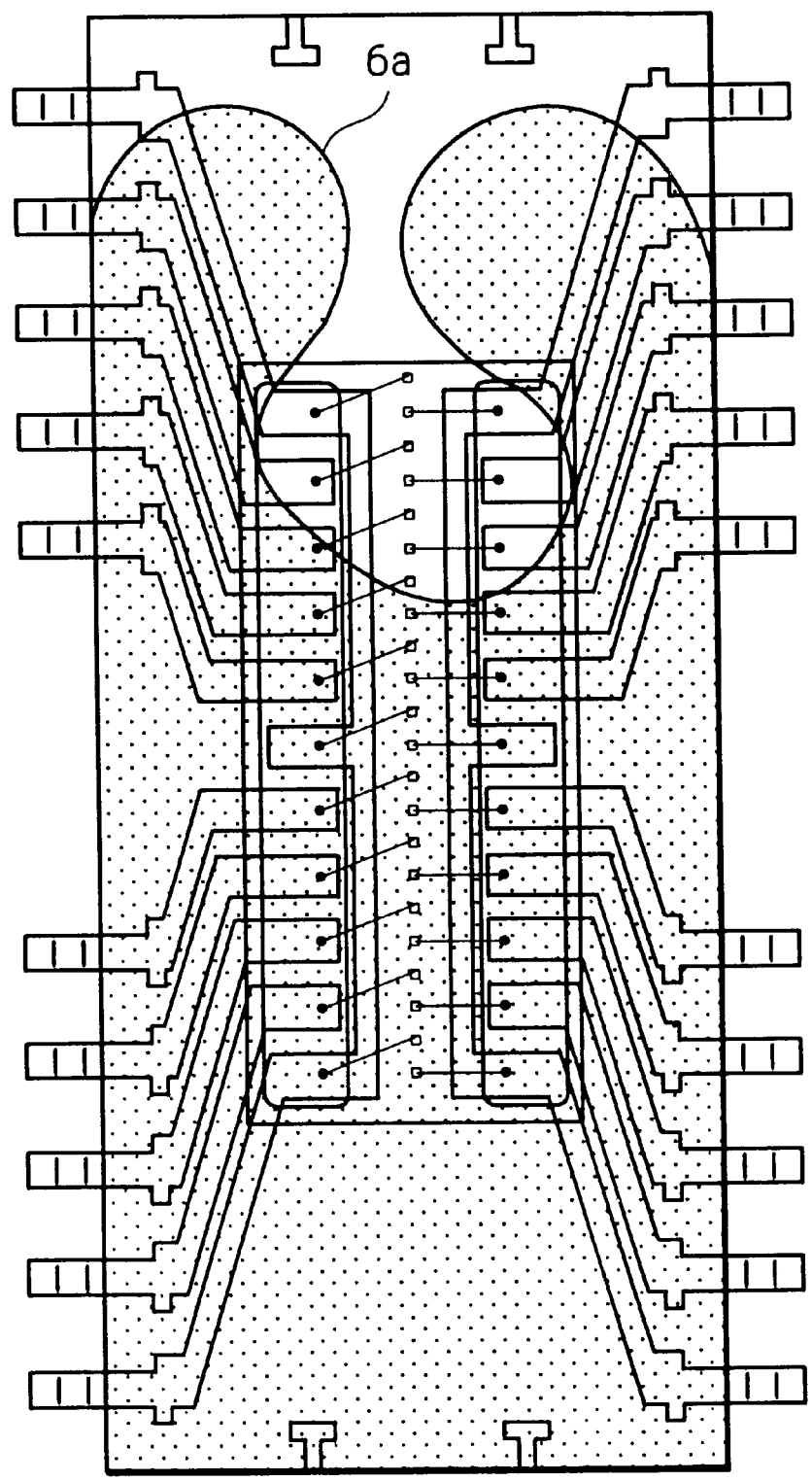
FIG. 6 is a plan view for explaining the problem created in the semiconductor device of FIGS. 3 and 4.

As seen from FIGS. 3 and 4, with the semiconductor element 1B occupying a small space relative to the size of the package, the region R where the thickness T1 of the sealing resin layer 6 on the upper surface of the inner leads 31 in an outer peripheral area (near the lateral surface of the package) of the semiconductor element 1B and the thickness T3 of the sealing resin layer 6 under the lower surface of the inner leads 31 are unbalanced is very large, and as a result, resin moves more rapidly on the upper surface than on the lower surface of the semiconductor element 1B in areas near the lateral surface of the package which gives rise to a problem of producing a winding void on the upper surface of the semiconductor element 1B as illustrated in FIG. 6, which reduces the manufacturing yield.

Additionally, the stress generated when the resin 6a contracts differs between the upper surface and the lower surface of the package which gives rise to a problem of a large warp of the package.

Further, while the thermal conductivity of the resin of the package is low, the thermal conductivity of the metal silicon of the semiconductor element 1B is high. Therefore, while the semiconductor element 1A of FIGS. 1 and 2 occupying a large space relative to the size of the package can be used to operate like a radiator for dispersing heat to every corner of the package, the semiconductor element 1B of FIGS. 3 and 4 occupying only a small space relative to the size of the package cannot disperse heat to every corner of the package which gives rise to a problem of a large thermal resistance.

Still further, since the bus bars 33 are arranged respectively between the front ends of the inner leads 31 and the electrodes 2 to exploit the effect of power sources such as $V_{CC}$ and GND, there is a problem of producing a risk of contact between the bus bars 33 and the bonding wires 5.

Figure 7:
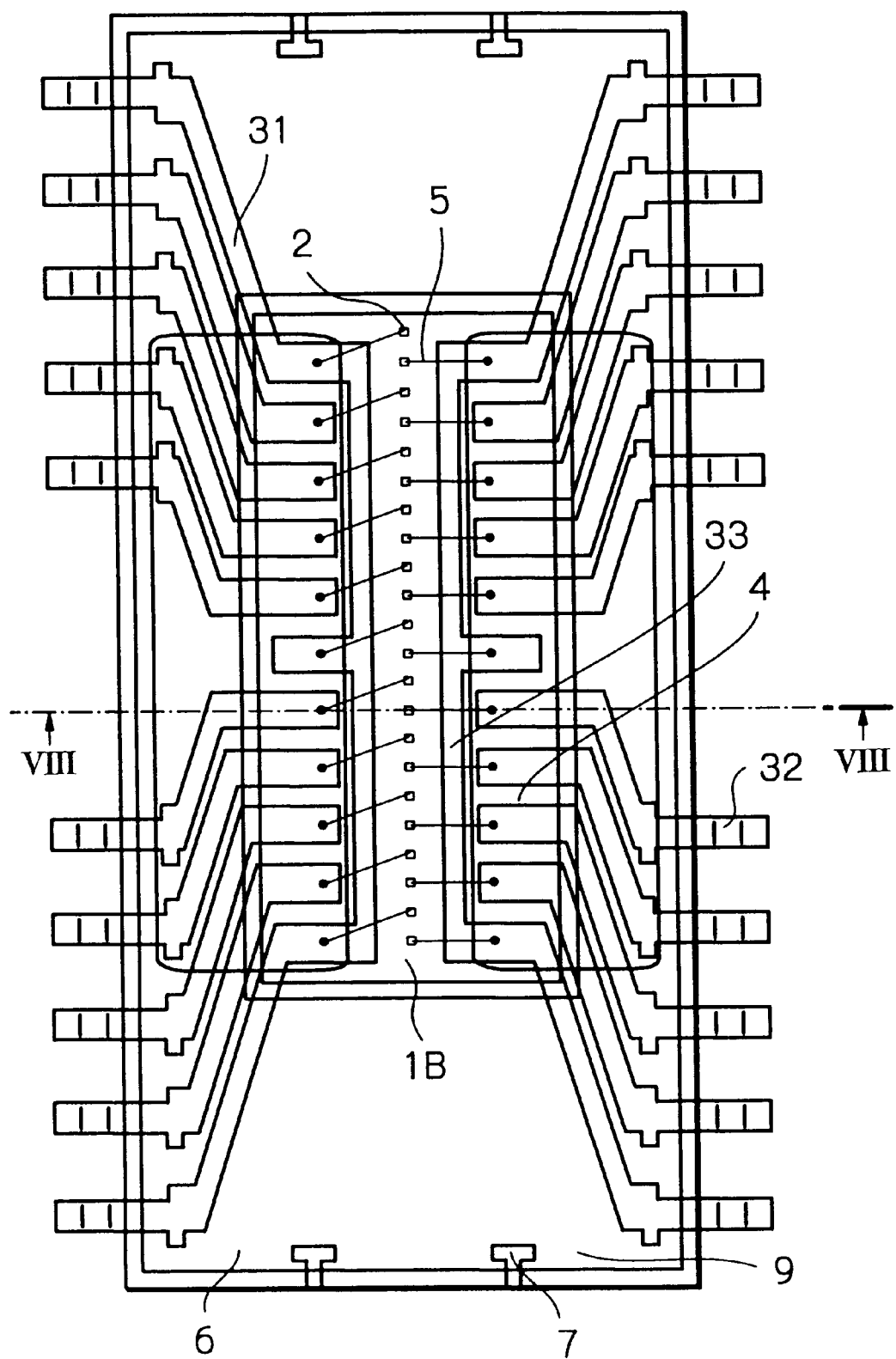
FIG. 7 is a plan view illustrating a first embodiment of the semiconductor device having an LOC structure according to the present invention.
Figure 8:
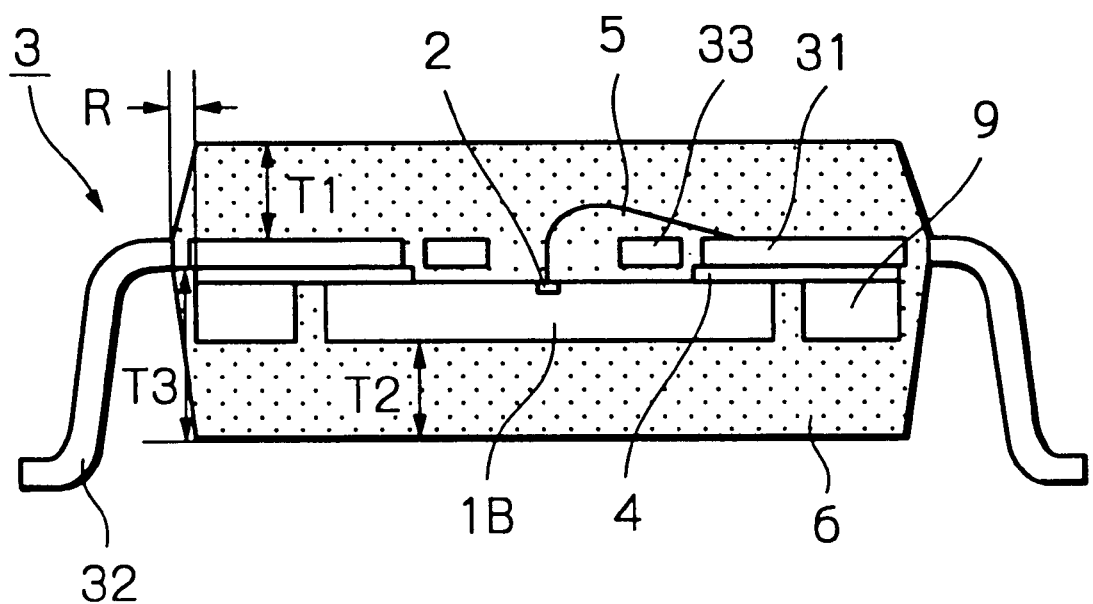
FIG. 8 is a cross-sectional view taken along the line VIII—VIII of FIG. 7.

FIG. 7 is a plan view illustrating a first embodiment of the semiconductor device according to the present invention, and FIG. 8 is a cross-sectional view taken along the line VIII—VIII of FIG. 7.

In FIGS. 7 and 8, a thin plate 9 is added to the elements of FIGS. 3 and 4. More specifically, the thin plate 9 is bonded to the inner leads 31 by means of the adhesive tape 4 in an outer peripheral area of the semiconductor element 1B. In this case, the thin plate 9 has substantially the same thickness as the semiconductor element 1B. As a result, the region R where the thicknesses of the sealing resin layer 6 are unbalanced is made very small.

While there are no restrictions with regard to the thin plate 9 arranged in the outer peripheral area of the semiconductor element 1B in terms of shape, thickness and material, it is preferable that the thin plate 9 has a contour at least 1 mm smaller than the contour of the package, or a clearance of greater than 0.5 mm at any side, whereas the opening for receiving the thin plate 9 has a contour at least 1 mm greater than the contour of the package, or a clearance of greater than 0.5 mm at any side, and that the thin plate 9 has substantially the same thickness as the semiconductor element 1B, which is typically between 200 and 400 μm, and is made of the same material as the lead frame 3, which is made of aluminum alloy or copper alloy, or a plastic or ceramic material. Additionally, the thin plate 9 preferably has through holes (not show) with a diameter of 0.5 mm, for example, in order to improve the adhesion of the thin plate 9 and the sealing resin layer 6.

Now, a first method for manufacturing the semiconductor device as illustrated in FIGS. 7 and 8 explained next with reference to FIGS. 9A through 9E.

Figure 9A:
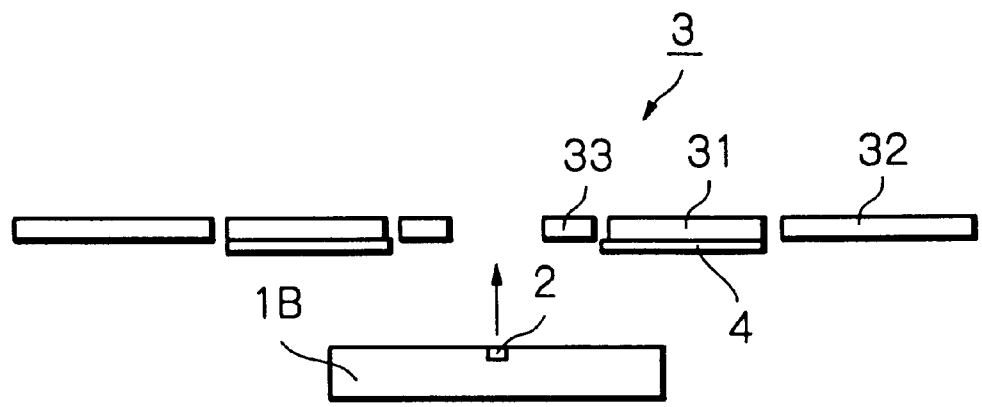
FIGS. 9A through 9E are cross-sectional views for explaining a first method for manufacturing the semiconductor device of FIGS. 7 and 8.

Firstly, referring to FIG. 9A, a semiconductor element 1B having electrodes 2 and a thickness between 250 and 400 μm and a lead frame 3 having inner leads 31, outer leads 32 and bus bars 33 are placed in position. Then, an adhesive tape 4 having a thickness between 50 and 100 μm and made of polyimide type film is bonded to the inner leads 31 and then the semiconductor element 1B is bonded to the lead frame 3.

Figure 9B:
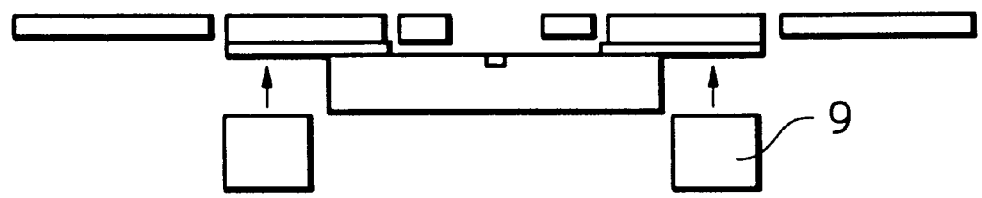

Next, referring to FIG. 9B, a thin plate 9 is bonded to the inner leads 31 and the bus bars 33 of the lead frame 3 by means of the adhesive tape 4. The thin plate 9 is made to show a thickness greater than that of the semiconductor element 1B by 50 to 100 μm in order to prevent the rear surface of the semiconductor element 1B from being damaged.

Figure 9C:
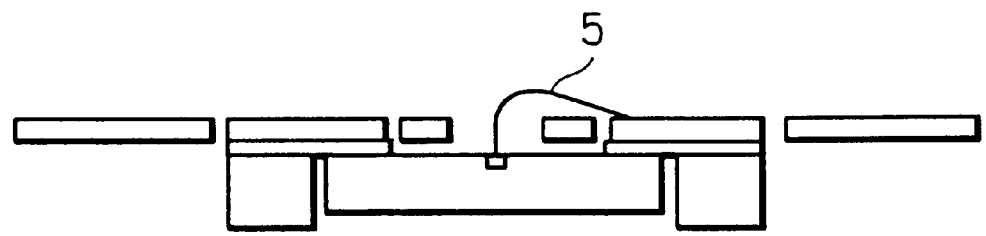

Next, referring to FIG. 9C, the electrodes 2 of the semiconductor element 1B and the corresponding inner leads 31 are connected by respective bonding wire 5 having a diameter of 23 to 30 μm. If necessary, the thin plate 9 and the electrode 2, or the thin plate 9 and the inner leads 31 are connected by means of the bonding wire 5.

Figure 9D:
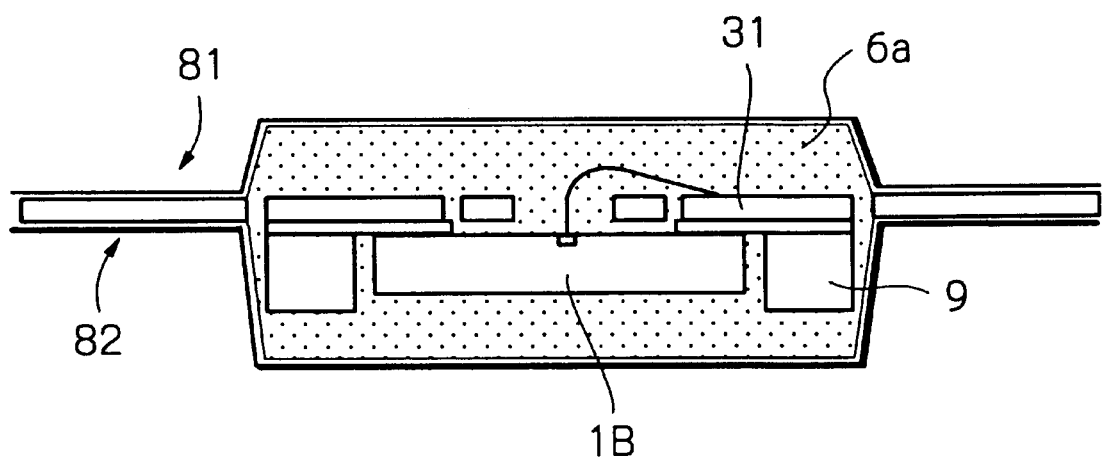

Next, referring to FIG. 9D, the lead frame 3 to which the semiconductor element 1B has been bonded is sandwiched by sealing metal mold halves 81 and 82 heated to 160 to 190° C., and resin 6a is injected under pressure into the space between the sealing metal mold halves 81 and 82. Note that the region where the thicknesses of the sealing resin layer 6 are unbalanced practically does not exist due to the thin plate 9 arranged in an outer peripheral area of the semiconductor element 1B. Thus, resin moves substantially at the same rate on the upper and lower surfaces of the semiconductor element 1B in areas near the lateral surface of the package so that, consequently, the flow pattern of sealed resin would not be disturbed.

Figure 9E:
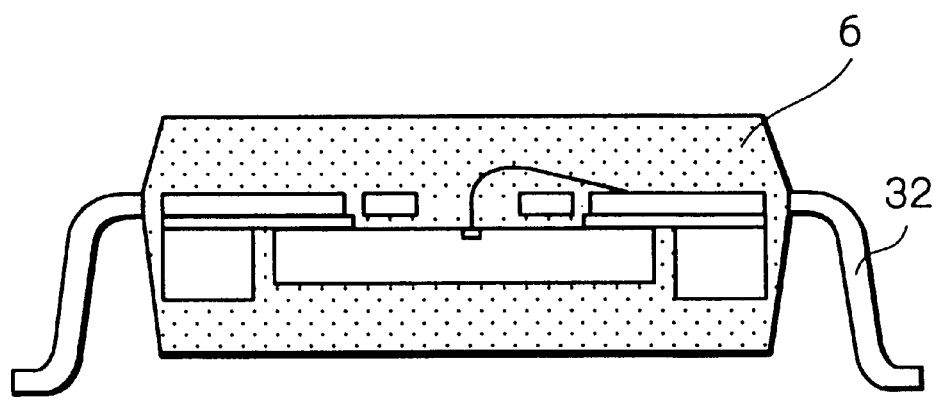

Finally, referring to FIG. 9E, after cutting and removing tie bars (not shown), the outer leads 32 are plated (not shown). Then, the outer leads 32 are cut and removed from the lead frame 3, and then shaped to show a desired profile to complete the semiconductor device.

A second method of manufacturing the semiconductor device as illustrated in FIGS. 7 and 8 will be explained next with reference to FIGS. 10A through 10E.

Figure 10A:
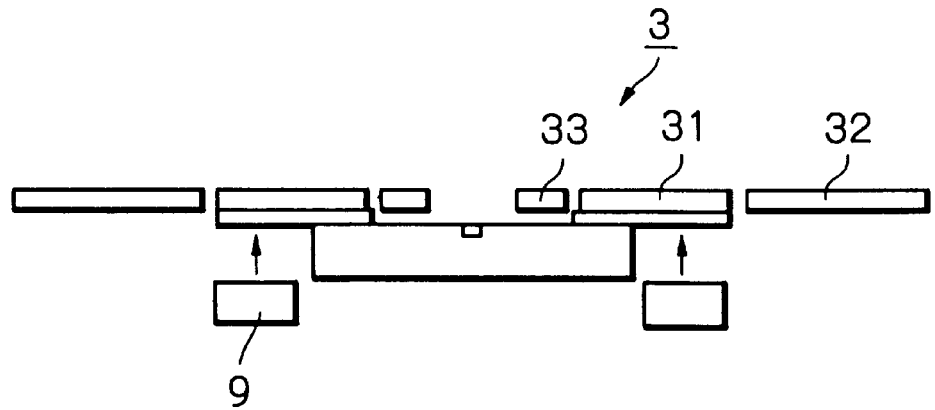
FIGS. 10A through 10E are cross-sectional views for explaining a second method for manufacturing the semiconductor device of FIGS, 7 and 8.

Firstly, referring to FIG. 10A, a semiconductor element 1B having electrodes 2 and a thickness between 250 and 400 μm and a lead frame 3 having inner leads 31, outer leads 32 and bus bars 33 are placed in position. Then, an adhesive tape 4 having a thickness between 50 and 100 μm and made of polyimide type film are bonded to the inner leads 31, and then the thin plate 9 is bonded to the inner leads 31 and the bus bars 33 of the lead frame 3.

Figure 10B:
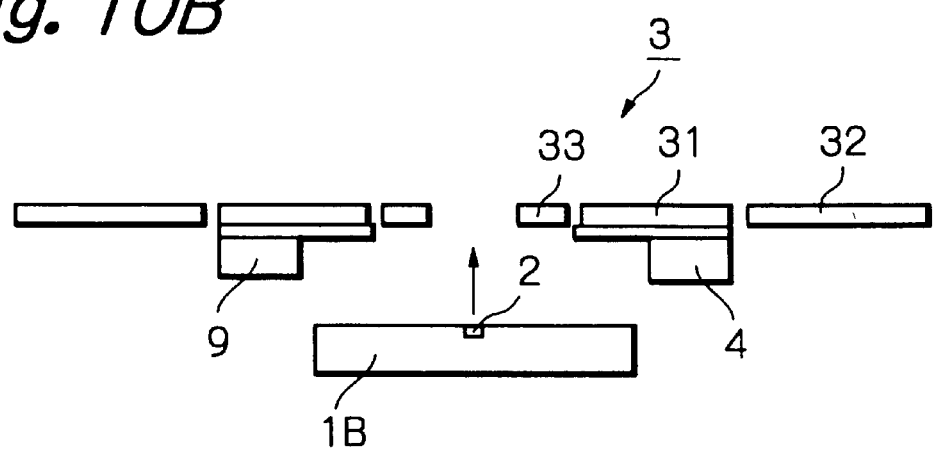

Next, referring to FIG. 10B, the semiconductor element 1B is bonded to the lead frame 3 by means of the adhesive tape 4. The thin plate 9 is made to show a thickness smaller than that of the semiconductor element 1B by 50 to 100 μm in order to make the semiconductor element 1B and the lead frame 3 reliably adhere to each other.

Figure 10C:
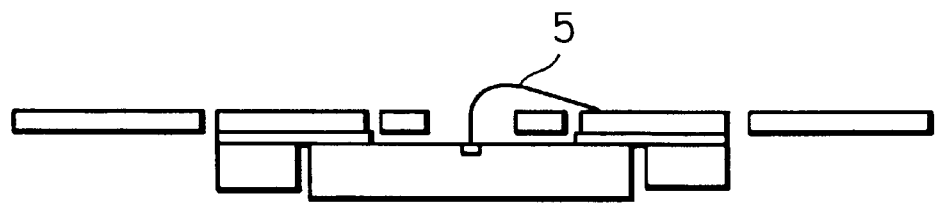

Next, referring to FIG. 10C, the electrodes 2 of the semiconductor element 1B and the corresponding inner leads 31 are connected by respective bonding wire 5 having a diameter of 23 to 30 μm as in the case of FIG. 9C.

Figure 10D:
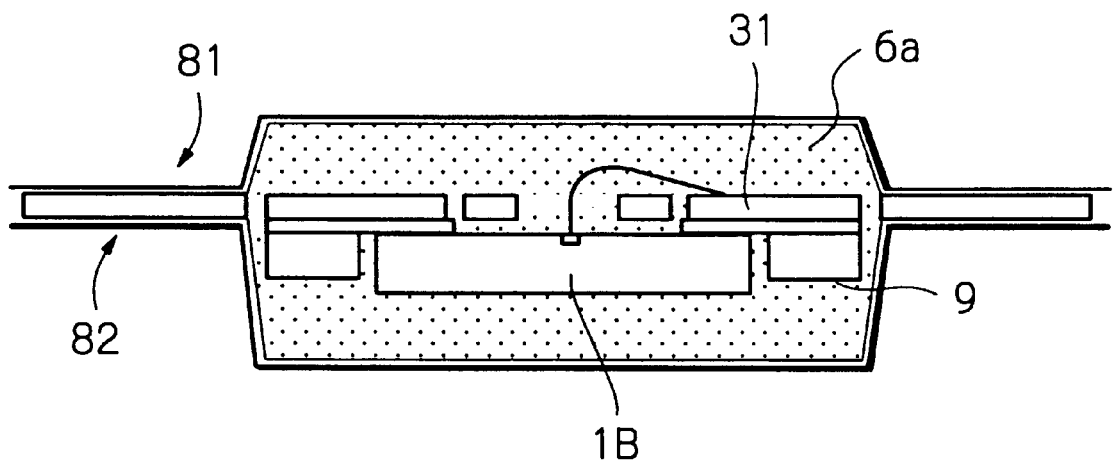

Next, referring to FIG. 10D, the lead frame 3 to which the semiconductor element 1B has been bonded is sandwiched by sealing metal mold halves 81 and 82 heated to 160 to 190° C., and resin 6a is injected under pressure into the space between the sealing metal mold halves 81 and 82 as in the case of FIG. 9D.

Figure 10E:
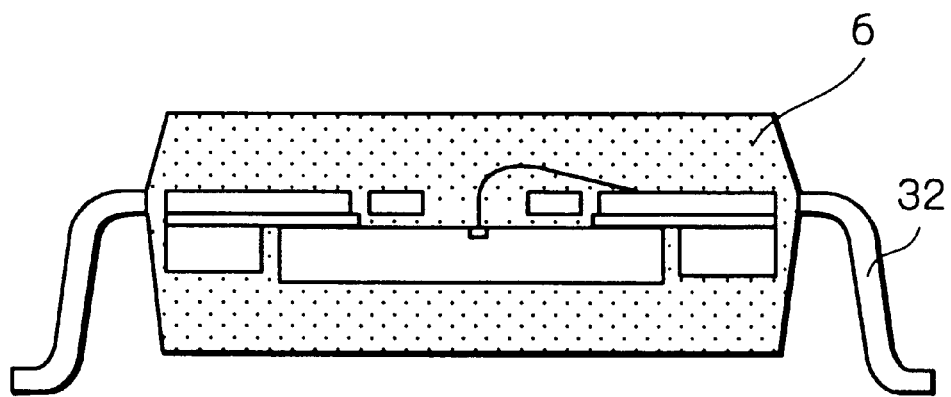

Finally, referring to FIG. 10E, after cutting and removing tie bars (not shown), the outer leads 32 are plated (not shown). Then, the outer leads 32 are cut and removed from the lead frame 3, and then shaped to show a desired profile to complete the semiconductor device.

Figure 11:
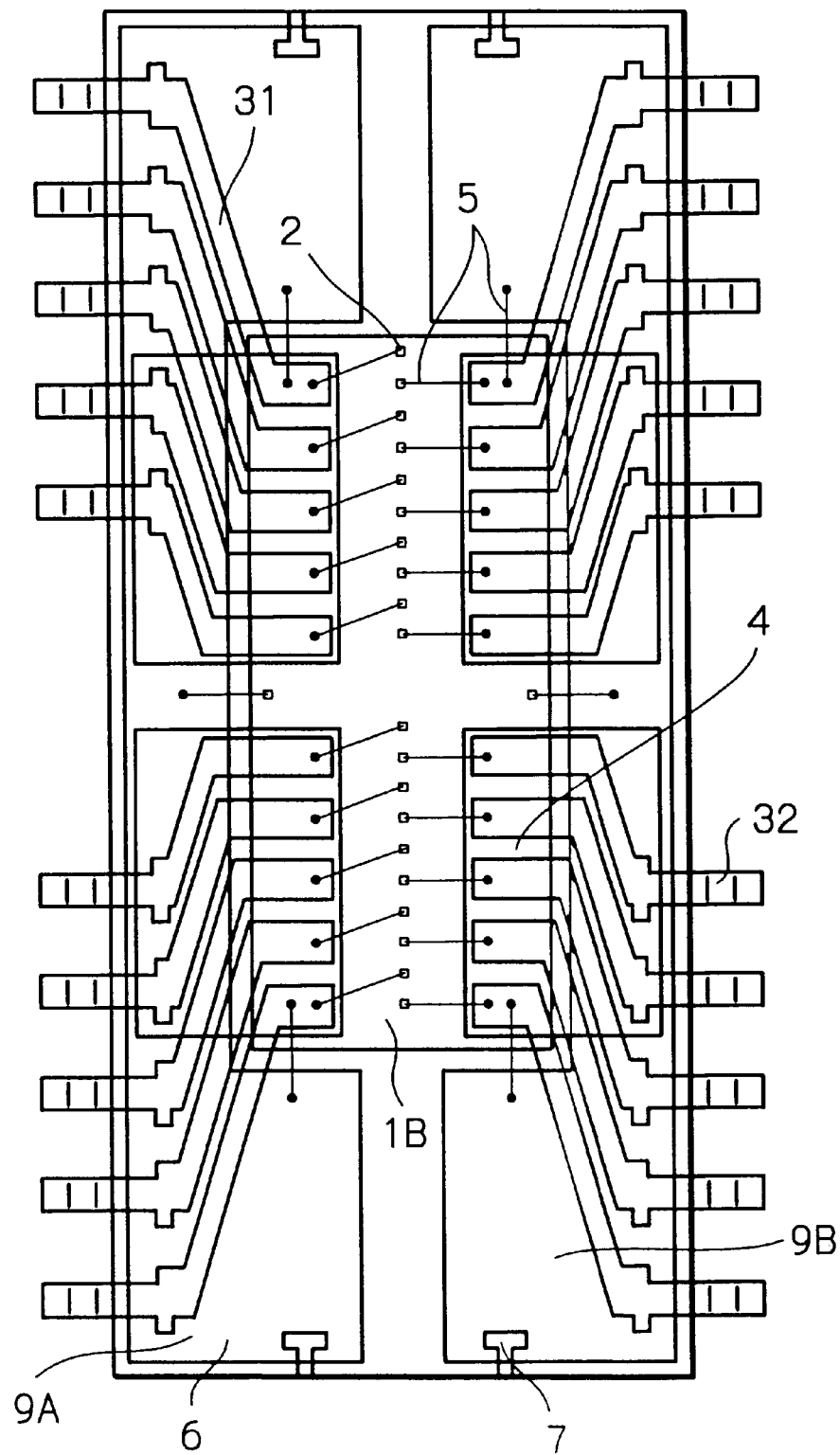
FIG. 11 is a plan view illustrating a second embodiment of the semiconductor device having an LOC structure according to the present invention.

FIG. 11 is a plan view illustrating a second embodiment of the semiconductor device according to the present invention. Here, the thin plate 9 of FIG. 7 is replaced by a pair of thin plates 9A and 9B and the silver plates (not shown) formed respectively on the thin plates 9A and 9B are connected to the corresponding electrodes 2 and the corresponding inner leads 31 by means of respective bonding wire 5 so that the thin plates 9A and 9B may operate as the bus bars 33 of FIG. 7. Thus, the process of over-lead bonding for making the bonding wire 5 pass over the bus bars 33 as illustrated in FIG. 8 is not required for the second embodiment.

Note that any of the above described methods for manufacturing the semiconductor device as illustrated in FIG. 7 can be used to manufacture the semiconductor device as illustrated in FIG. 11.

As explained hereinabove, according to the present invention, the problem of producing a winding void can be avoided as a result of the use of a thin plate, which improves the manufacturing yield. Additionally, since the stress generated when the resin contracts can be substantially equalized between the upper surface and the lower surface of the package, the problem of a large warp of the package can be avoided. Still further, since the thin plate is arranged in an outer peripheral area of the semiconductor element, heat can be dispersed to every corner of the package to reduce the thermal resistance thereof by using a material having a high thermal conductivity such as metal for the thin plate. Finally, since the thin plate arranged in a peripheral area of the semiconductor element can be used as bus bars to eliminate the need of arranging bus bars between the front ends of the inner leads and the electrodes to exploit the effect of the power sources such as $V_{CC}$ and GND, the problem of producing a risk of contact between the bus bars and the bonding wire can be avoided, thus, improving the manufacturing yield and the reliability of the semiconductor device.

What is claimed is:

1. A semiconductor device having a lead-on-chip structure, comprising a thin plate arranged in an outer peripheral area of a semiconductor element and having a thickness substantially the same as that of said semiconductor element, a lead frame having inner leads and outer leads and bus bars, and a sealing resin completely surrounding said thin plate said lead frame and said semiconductor element.

2. The device as set forth in claim 1, wherein said thin plate is divided into a plurality of pieces.

3. The device as set forth in claim 1, wherein a plurality of through holes are formed through said thin plate.

4. A semiconductor device comprising:

a lead frame having inner leads and outer leads and bus bars;

a semiconductor element bonded to said inner leads and said bus bars by means of an adhesive tape; and a thin plate having a plurality of through holes formed therethrough, arranged in an outer peripheral area of said semiconductor element and bonded to said inner leads and said bus bars by means of said adhesive tape.

5. The device as set forth in claim 4, wherein said thin plate is divided into a plurality of pieces.

6. The device as set forth in claim 4, wherein said thin plate is electrically conductive, and is bonded to said inner leads by an adhesive tape.

7. A semiconductor device comprising:

a lead frame having inner leads, outer leads and bus bars;

a semiconductor element bonded to said inner leads and said bus bars by means of an adhesive tape; and a thin plate arranged in an outer peripheral area of said semiconductor element and bonded to said inner leads and said bus bars by means of said adhesive tape.

8. The device as set forth in claim 7, wherein said thin plate is divided into a plurality of pieces.

9. The device as set forth in claim 7, wherein a plurality of through holes are formed through said thin plate.

10. The device as set forth in claim 7, wherein said thin plate is electrically conductive and bonded to said inner leads by an adhesive tape.

* * * * *